United States Patent
Wong

(10) Patent No.: US 6,734,533 B2
(45) Date of Patent: May 11, 2004

(54) ELECTRON-BEAM TREATED CDO FILMS

(75) Inventor: Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/161,104

(22) Filed: May 30, 2002

(65) Prior Publication Data

US 2003/0224593 A1 Dec. 4, 2003

(51) Int. Cl.$^7$ ............................................... H01L 23/58
(52) U.S. Cl. ...................................... 257/632; 438/778
(58) Field of Search ........................... 257/632; 438/778

(56) References Cited

U.S. PATENT DOCUMENTS

| | | | |
|---|---|---|---|
| 4,848,141 A | 7/1989 | Oliver et al. ................. | 73/81 |
| 6,340,628 B1 * | 1/2002 | Van Cleemput et al. .... | 438/586 |

OTHER PUBLICATIONS

Hara et al., "Mechanism of mechanical and chemical polishing in low dielectric constant plasma–enhanced chemical vapor deposition SiOC layer from hexamethyldisiloxane", Aug. 2001, Electochem. and Solid–State Lett., vol. 4, No. 8, P. G65–67.*

Music et al., "Synthesis and mechanical properties of boron suboxide thin films", Apr. 2002, J. Vac. Sci. Technol. A 20(2), p. 335–337.*

P.T. Liu et al., Thin Solid Films 332 (1998) 345–350.

E. Kondoh, Electrochemical and Solid–State Letters, 1, (5) 224–226 (1998).

Gidley et. al., Applied Physics Letters, 76 (2000) p. 1282.

Loboda et. al., Using trimethylsilane to improve safety, throughput and versatility in PECVD processes, Proceedings of the Symposium on Silicon Nitride and Silicon Dioxide Thin Insulating Films, 1997, p. 445–453.

Loboda et. al., Deposition of low–k dielectric films using trimethylsilane, Proceedings of the Symposia on Electrochemical Processing in ULSI Fabrication and Interconnect and Contact Metallization: Materials, Processes, and Reliability, 1998, p. 145–152.

Sugahara et. al., Low Dielectric Constant Carbon Containing $SiO_2$ Films Deposited by PECVD Techniques Using a Novel CVD Precursor, International dielectrics for ULSI multilevel interconnection conference, 1997, p. 19–25.

Kanaya K. and Okayama S., Journal of Physics D. Applied Physics. 5:43 (1972).

* cited by examiner

Primary Examiner—Nathan J. Flynn
Assistant Examiner—Scott R. Wilson
(74) Attorney, Agent, or Firm—Fish & Richardson P.C.

(57) ABSTRACT

A method of forming an integrated circuit including forming a dielectric film is described. The forming of the dielectric film includes: providing a substrate, providing a carbon doped oxide film on the substrate, and treating the carbon doped oxide film with an electron beam. The carbon doped oxide film can be provided by chemical vapor deposition.

18 Claims, 5 Drawing Sheets

ELECTRON-BEAM TREATED CDO FILMS

TECHNICAL FIELD

This application relates to electron beam treated carbon doped oxide (CDO) films.

BACKGROUND

One method to reduce interconnect signal transmission delays (RC delays) is to utilize low dielectric constant (k) materials in advanced microelectronics interlevel dielectric films (ILD). To achieve low dielectric constants, a material which inherently possesses a low dielectric constant can be used and/or porosity can be introduced into a film. By increasing the film void fraction or porosity, the thermal-mechanical properties of the material can be degraded. Because of the diminished mechanical properties, process integration of a highly porous ILD film in an interconnect structure can be a challenge. For instance, the application of chemical/mechanical polishing (CMP) used to produce copper (Cu) damascene structures can induce mechanical failures that result in delamination or tearing of the underlying ILD films. The control of the erosion/dishing of the Cu lines determines the amount of shear imposed to these weaker ILD materials. Similarly, packaging can subject interconnect layers to severe shear and normal forces.

DESCRIPTION OF DRAWINGS

Like reference symbols in the various drawings indicate like elements.

DETAILED DESCRIPTION

Figure 1:
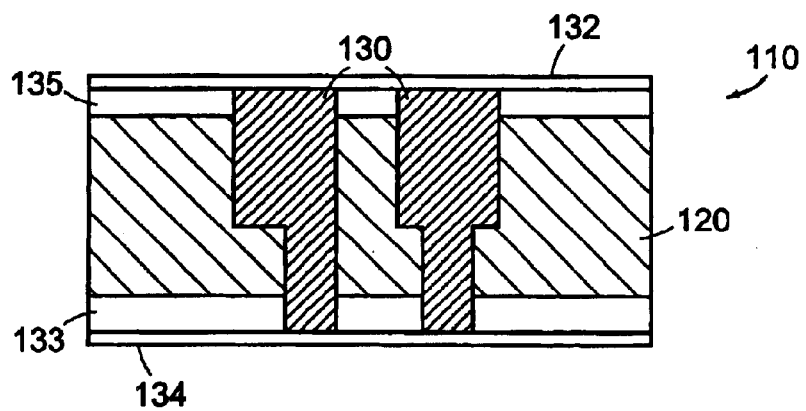
FIG. 1 is a schematic cross section of an integrated circuit with an interconnect and interlevel dielectric film.

Referring to FIG. 1, an integrated circuit 110 includes a first circuit structure at one level e.g. a top circuit structure 132 and another circuit structure at another level, e.g. a bottom circuit structure 134. The circuits are separated from each other by an interlevel dielectric 120 and are connected by interlevel interconnects 130 which have been patterned through etchstop layers 133 and 135. In some embodiments, the integrated circuit 110 can have only one or no etch stop layers. Furthermore as is discussed below, etch stop layers initially deposited can be removed during processing or new etchstop layers can be deposited in intermediate processing blocks. Such choices are suited to the particular processing blocks and the particular application for the circuit. The interconnects 130 are conductive, e.g. copper. The interlevel dielectric 120 is a low k carbon doped oxide (CDO) film.

Figure 2:
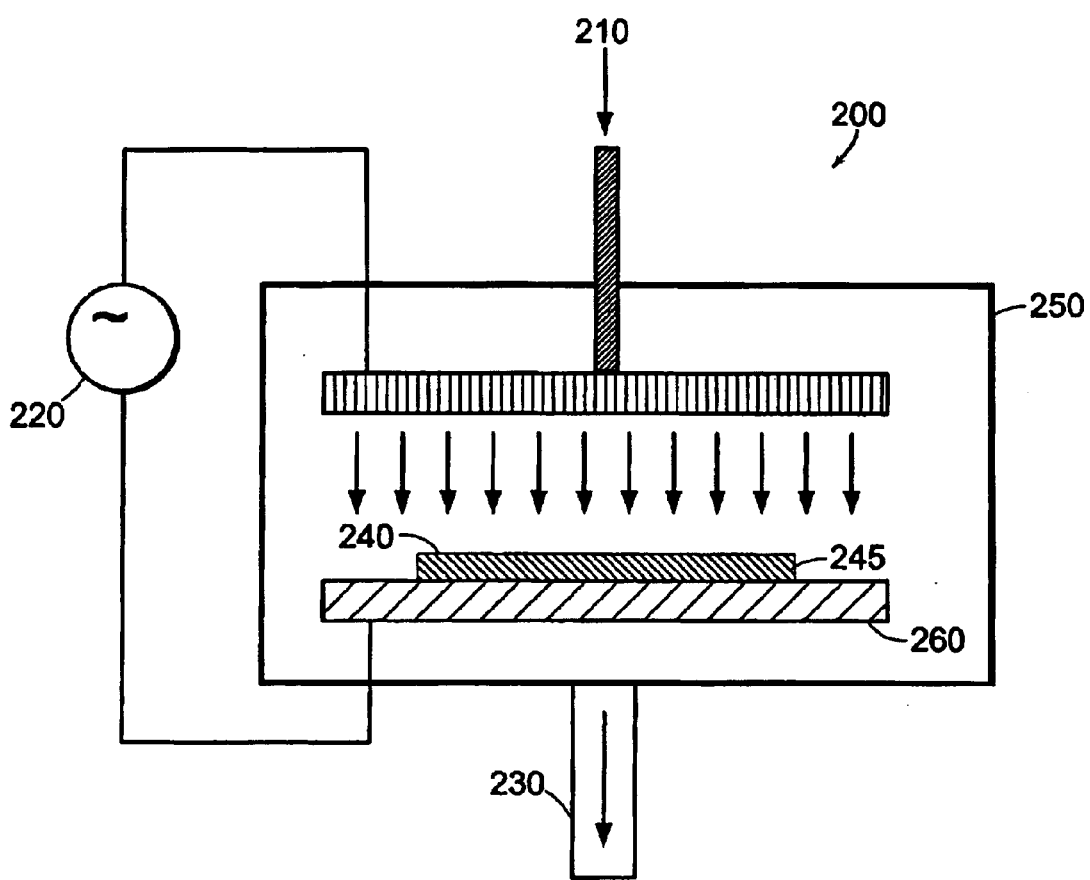
FIG. 2 is a schematic cross section of the plasma enhanced chemical vapor deposition (PECVD) chamber for producing the low k dielectric CDO films.

Referring to FIG. 2, one method by which CDO ILD films can be produced is plasma-enhanced chemical vapor deposition (PECVD). In PECVD, a CDO film 240 is deposited on a silicon wafer 245 formed in a reactor chamber 250 which includes gas precursor inlet ports 210, vacuum outlet ports 230, an RF voltage source 220, and a sample stage 260. Films are deposited as a result of chemical reactions which occur between precursor gases which are introduced into the chamber via port 210. Voltage supply 220 excites the gases into a plasma. By varying the radio frequency (RF) excitation energy and by varying the temperature of the chamber, chemical reactions between the precursors are induced and the resulting products form the desired deposited film 240. Byproducts are removed from the chamber 250 via port 230 which is attached to a vacuum line. In addition, port 230 controls the residence times of the various compounds and chemical by products in the chamber. After the film has been deposited, the film can be removed from the chamber by transporting the wafer 245 and therefore the film 240 to a loading/unloading chamber of the apparatus (not shown). Typical CDO films are stoichiometrically $Si_wC_xO_yH_z$; the film structure typically contains numerous methyl groups. The porosity of the film can be controlled by varying deposition parameters such that preservation of methyl groups is maintained and crosslinking of the film is controlled to minimize dipole moments. Superposition of a pulsed plasma is sometimes applied to enhance porosity. The density of the films is preferably in the range less than about 2 g/cm$^3$, for example about 1.3 to about 1.4 g/cm$^3$. Typically the films will have a dielectric constant from about 2.3 to about 4.0, for example, less than about 3.0. The films may have an open pore structure (i.e. a pore structure characterized by interconnecting pore channels as opposed to single passage closed channels). Open and closed channel pores can be detected and characterized by methods like positronium annihilation lifetime spectroscopy (PALS) described by Gidley et. al., Applied Physics Letters, 76 (2000) p. 1282. A suitable PECVD apparatus is an Eagle 10 (manufactured by ASM Japan K.K., Tokyo, Japan). Other deposition tools are manufactured by Applied Materials, Inc, Trikon Technologies, and Mattson Technologies. A batch type system in which multiple wafers are treated simultaneously is available from Novellus Systems, Inc. Forming dielectric films from various precursor gases is discussed in "Using trimethylsilane to improve safety, throughput and versatility in PECVD processes", Loboda et. al., Proceedings of the Symposium on Silicon Nitride and Silicon Dioxide Thin Insulating Films, 1997, p. 445–453; "Deposition of low-k dielectric films using trimethylsilane", Loboda et. al., Proceedings of the Symposia on Electrochemical Processing in ULSI Fabrication and Interconnect and Contact Metallization: Materials, Processes, and Reliability, 1998, p. 145–152; and "Low Dielectric Constant Carbon Containing SiO$_2$ Films Deposited by PECVD Techniques Using a Novel CVD Precursor", Sugahara et. al., International dielectrics for ULSI multilevel interconnection conference, 1997, p. 19–25.

Figure 3:
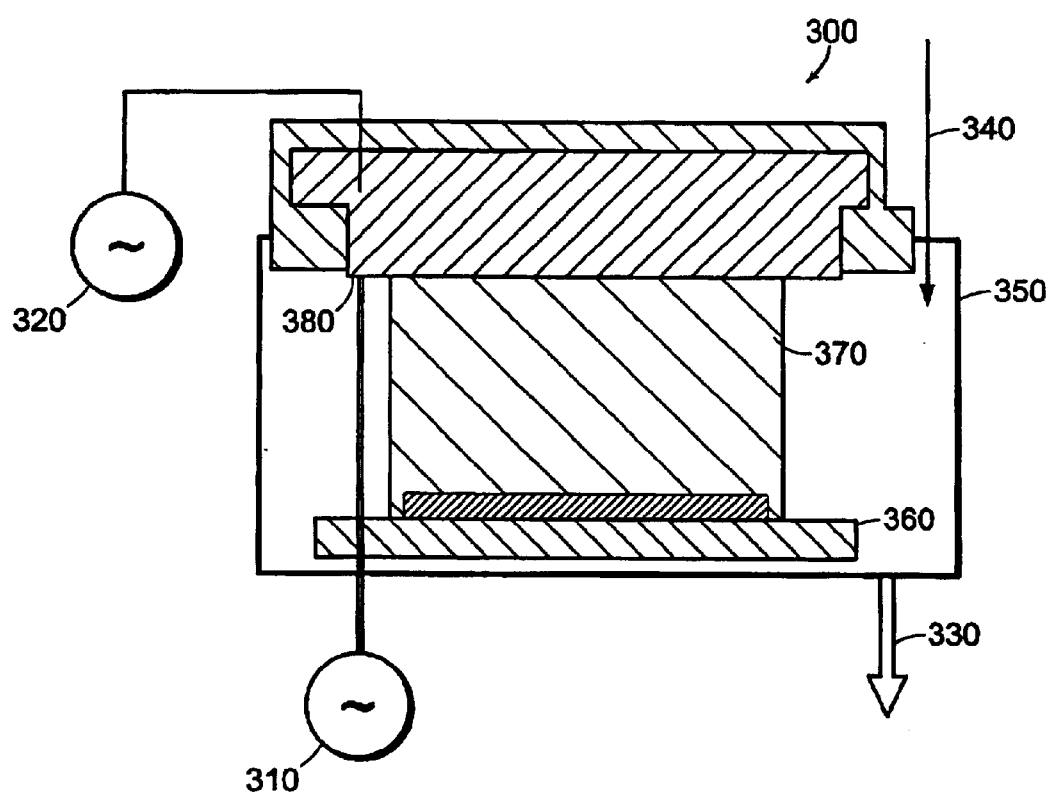
FIG. 3 is a schematic cross section of the electron beam chamber used to cure the low k dielectric CDO films.

Referring to FIG. 3, the CDO films are cured by exposure to an electron beam to enhance the mechanical properties of the film. A CDO film on a wafer substrate 370 is cured in electron beam chamber 350 which includes a low voltage supply 320, a high voltage supply 310, an anode grid 380, a sample stage 360, and gas inlet ports 340 and vacuum outlet ports 330. The substrate 370 is loaded through a loading/unloading chamber (not shown) that is connected to the main reactor chamber 350. Port 340 allows for gases, typically inert noble gases like He or Ar, to be introduced into the chamber. Port 330 is connected to a vacuum line. The low voltage supply 320 controls the electron beam current by biasing the systems such that a current of electrons flows from the electron source (not shown) to the anode grid 380. The high voltage supply 310 is used to control the potential of the anode grid 380. A suitable electron beam apparatus is an ElectronCure™ (1200/1300), available from Electron Vision Corporation (San Diego, Calif.).

The energy of the electrons in the beam and the overall flux of electrons are controlled to effect curing of the CDO film. By controlling the electron beam current and the time of the exposure, the overall electron flux (ie dosage) is controlled. The high voltage supply 320 controls the energy of the electron beam that emerges from the grid (e.g. about 1 keV to about 30 keV).

The electron beam energy determines the elastic scattering length of the electrons incident on a material. This distance, r, is know as the Kanaya-Okayama range, and it is given by $$r = \frac{2.76 \times 10^{-2} A E_0^{1.67}}{\rho Z^{0.89}}. \quad (1)$$

where A is the atomic mass, Z is the atomic number, $\rho$ is the density, and $E_0$ is the accelerating voltage for the electrons (see Kanaya K. and Okayama S., Journal of Physics D. Applied Physics. 5:43 (1972)). The Kanaya-Okayama range is an indication of the distance into the film that the incident electron beam will travel. Typically, the entire cross section of the CDO film will be exposed to electron flux and thus in preferred embodiments the Kanaya-Okayama range is greater than the thickness of the CDO film. In this manner, Eq. (1) is used to estimate the electron beam energy necessary so that the Kanaya-Okayama range is greater than the film thickness.

Electron-beam energies maybe about 3 to about 8 keV with fluxes of about 3000 to about 5000 $\mu C/cm^2$ to enhance the mechanical properties of the CDO films. The enhanced mechanical properties can be measured by the elastic modulus and hardness of the film. For example, electron-beam cured low k CDO films can have a modulus in the range of about 11.5 to about 25 GPa. Electron-beam cured low k CDO films can have a hardness in the range of about 1.9 to about 3.3 GPa. CDO hardness and elastic modulus can be at least 50% or 70% harder and at least 50% or 200% stiffer than the hardness and elastic modulus of the CDO film prior to curing.

EXAMPLE 1

A series of CDO films are prepared on a silicon substrate by CVD. The CVD apparatus is an Eagle 10 (manufactured by ASM Japan K.K., Tokyo, Japan). (This description is for a typical 200 mm wafer process; however, this can be scaled to a 300 mm wafer process.) A 200 mm Si wafer is placed into the CVD chamber. A mixture of gases is introduced into chamber. The mixture is typically an organosilane precursor (such as Z3MS available from Dow Corning, Midland, Mich., 4MS available from ATMI, San Jose, Calif., DMD-MOS available from Schumacher, Carlsbad, Calif. or Trichemical Laboratory Inc., Yamanashi, Japan) and helium or argon operated at a pressure range from about 200 Pa to about 2000 Pa. The wafer is exposed to a RF excitation power with a power density range from about 0.3 W/cm$^2$ to about 3 W/cm$^2$ at a temperature range from about 300° C. to about 450° C. Manufacturable film deposition rates are typically in the 300 nm/min to 1000 nm/min range. Typical film thicknesses are in the range of about 300 nm to 1600 nm. After exposure, the wafers are removed from the CVD chamber.

The films are exposed to either ultraviolet UV radiation or to an electron beam. The UV exposure is carried out using a 200 mm UV radiation tool, PCUP, manufactured by Axcelis (Rockville, Md.). The apparatus utilizes a UV bulb. The bulbs H-Mod, D-Mod, and HL were used for the curing of the three respective samples. During the exposure, the samples are maintained in an Argon atmosphere with a pressure of about 1 atmosphere.

The electron beam exposures are carried out using an electron beam apparatus such as the ElectronCure™ (1200/1300) manufactured by Electron Vision. For the exposure, the low voltage is maintained to extract a beam current and direct the current to the substrate. The high voltage supply maintains the cathode at about 10 kV to about 30 kV (typical) and the low voltage anode grid typically operates from about 10 V to about 200 V to produce an electron flux. The product of exposure time and the beam current controls the overall flux to be in the range from about 3000 $\mu C/cm^2$ to about 5000 $\mu C/cm^2$. During the exposure, the chamber atmosphere is a He or Ar, atmosphere (non-reactive) with a pressure of about 8 mTorr to about 50 mTorr and room temperature (heating of CDO films is optional).

| Wafer ID | Treatment | Conditions |
|---|---|---|
| A | H-Mod bulb | UV radiation, Ar flow |
| B | D-Mod bulb | UV radiation, Ar flow |
| C | HL bulb | UV radiation, Ar flow |
| D | Electron beam cure | 3keV, 3000 $\mu C/cm^2$ |
| E | Electron beam cure | 8keV, 3000 $\mu C/cm^2$ |
| F | Electron beam cure | 3keV, 5000 $\mu C/cm^2$ |

Figure 4:
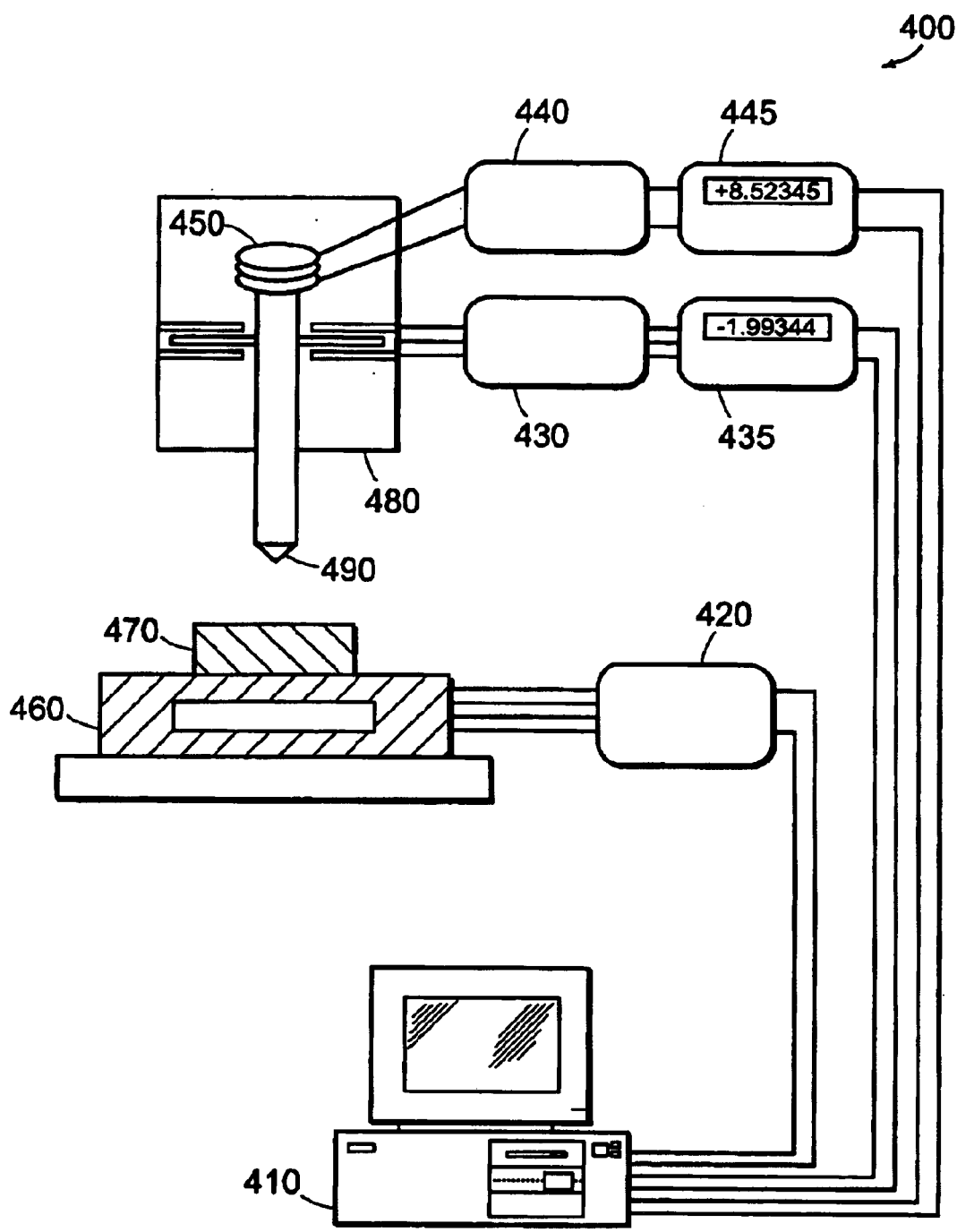
FIG. 4 is a schematic depiction of the Berkovich indenter used to measure the modulus and hardness of the CDO films.

Referring to FIG. 4, the modulus and hardness of a CDO film 470 is tested using a Berkovich indenter. (MTS Nanoindenter XP with a Berkovich diamond tip available from MTS (formerly Nano Instruments Innovation Center), Oak Ridge, Tenn. Also see Method for Contact Determination of the Elastic Stiffness of Contact between Two Bodies, U.S. Pat. No. 4,848,141.)

Briefly, the Berkovich indenter 400 has a 3-sided diamond tip 490 with 65.3 degrees face angles and an indenter head 480 with a magnet and coil unit 450, a programmable current source 440, a capacitive displacement gage 430, voltmeters 435 and 445, a motorized stage 460, stage controllers 420, and a computer 410. The displacement of the indenter tip 490 is measured by the capacitive displacement gage 430 and the load on the indenter tip is measured by the coil and magnet 450 coupled to the programmable current source 440. Both the current source 440 and the capacitive displacement gage output the data as a voltage which is measured by the voltmeters 435 and 445. The computer 410 records the output voltages of voltmeters 435 and 445 to produce a load vs. displacement data set. Furthermore, computer 410 controls the stage controller 420 which drives the motorized stage 460.

From the displacement vs. load data generated from the indenter, both the modulus and hardness of the films is calculated. Fifteen indents are performed on each sample in continuous stiffness mode. This means that the indenter is always in contact with the film. Hardness and modulus as a function of indenter contact depth is calculated for each indent performed. These 15 data curves are then averaged together to give a final, averaged hardness and modulus curve as a function of indenter depth for the sample.

Briefly, elastic modulus (E) and hardness (H) are calculated using the following formulas:

$$E_r = \frac{\sqrt{\pi}}{2} \frac{S}{\sqrt{A}} \text{ and} \quad (2)$$

$$H = \frac{P_{max}}{A} \quad (3)$$

where S is the stiffness, P is the indenter load, and A is the indenter contact area. From the reduced modulus, the modulus E is defined as $$E = E_R(1-v^2) \quad (4)$$

where v is Poisson's ratio for the sample. Poisson's ratio is estimated to be 0.25 for low k materials (the value of 0.17 is for $SiO_2$)

Values reported for hardness and modulus are taken from a plateau region in the H/E plots. For modulus, this is usually in the first 10% of the film. For hardness, this is usually in the first 20% of the film. Values are taken near the surface due to increasing substrate effects as the indenter tip moves deeper into the film. The hardness and modulus numbers reported are averages over this plateau contact depth range. The standard deviation reported reflects the variation along the displacement range. This is normally less than 10%.

Using the indenter described, the CDO films from Table 1 are tested. The contact depth for the modulus measurements is about 100 nm to about 250 nm. The contact depth for the hardness measurements is about 400 nm to about 600 nm.

Results for hardness and elastic modulus are summarized in Table 2.

| Wafer ID | Modulus (GPa) | Contact Depth (nm) | Hardness (GPa) | Contact Depth (nm) |
|---|---|---|---|---|
| UV cured CDO films | | | | |
| A | 8.54 ± 0.90 | 100–250 | 1.69 ± 0.08 | 400–600 |
| B | 9.47 ± 0.72 | 100–250 | 1.80 ± 0.06 | 400–600 |
| C | 10.15 ± 0.63 | 100–250 | 1.88 ± 0.06 | 400–600 |
| Electron Beam cured CDO films | | | | |
| D | 12.78 ± 0.40 | 100–250 | 1.91 ± 0.02 | 400–600 |
| E | 22.78 ± 0.41 | 100–250 | 3.08 ± 0.05 | 400–600 |
| F | 11.90 ± 0.24 | 100–250 | 1.80 ± 0.04 | 400–600 |

Figure 5:
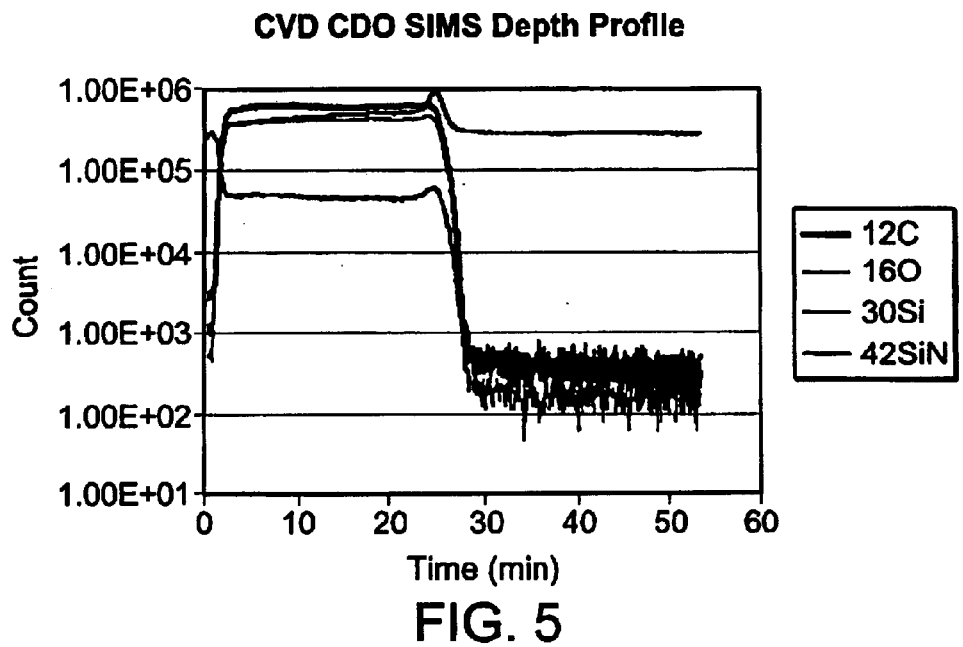
FIG. 5 is a secondary ion mass spectroscopy depth profile data from a sample of electron beam cured CDO film.
Figure 6:
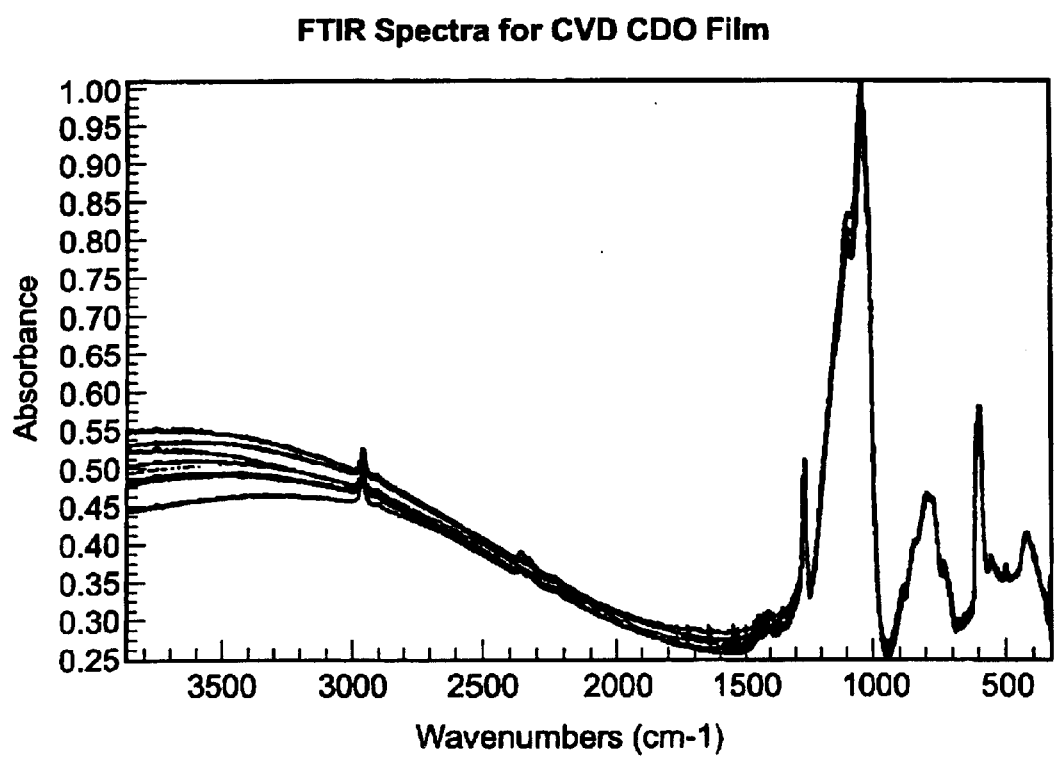
FIG. 6 is FTIR spectra for electron beam cured CDO film.
Figure 7A:
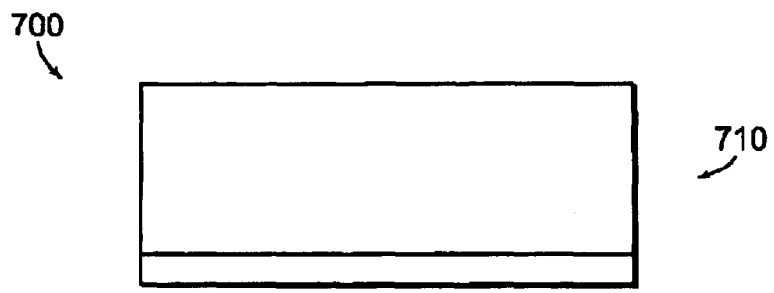
FIG. 7 is a schematic depiction of the processing method for creating a dual damascene interconnect.
Figure 7B:
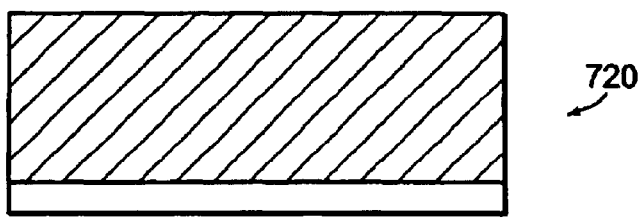
Figure 7C:
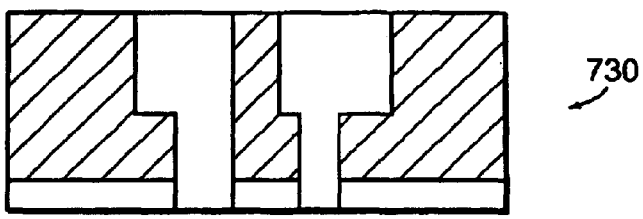
Figure 7D:
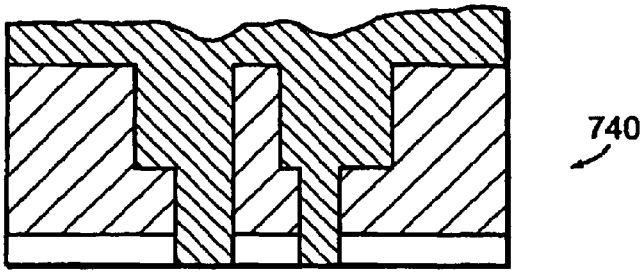
Figure 7E:
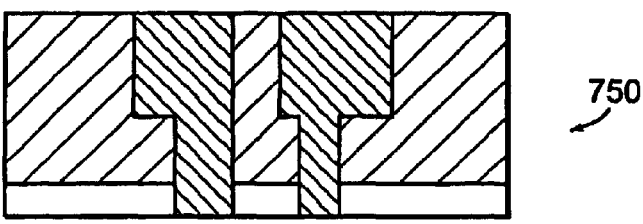

The cured films can also be characterized using various spectroscopies. The electron beam cured CDO films are characterized by both Fourier transform infrared spectroscopy (FTIR) and secondary ion mass spectroscopy (SIMS). Referring to FIG. 5, Sims data is shown for an electron beam cured CDO film. Referring to FIG. 6, FTIR spectra are shown for an electron beam cured CDO film.

Referring to FIG. 7, a method 700 is outlined by which the integrated circuit of FIG. 1 may be produced. In 710, the CDO ILD film is formed. In 720, the CDO ILD is cured by exposure to an electron beam. In 730, a dual damascene structure is patterned into the integrated circuit typically using reactive ion etching (RIE). In 740, the damascene structure and the top layer of the integrated circuit is filled with a metal using metal deposition techniques. In 750, the excess metal is removed by CMP. This CMP block is one of the blocks where the mechanical properties of the ILD film must be such that the ILD can withstand the strains imposed by the processing block.

As described above, in some embodiments method 700 can include depositing etchstop or hardmask layers. For example, method 700 can include depositing a hardmask layer that is patterned and aids in forming the structures of block 730. In some embodiments, the hardmask layer is removed during the CMP of 750. In yet other embodiments, the hardmask is not removed and can serve as a layer upon which other structures can be deposited or in other embodiments, the hardmask is left to act as a protective layer.

Other embodiments include using both UV and electron beam cures.

Still other embodiments are in the following claims.

What is claimed is:

1. An integrated circuit, including a dielectric film comprising a CDO film having a modulus of about 20 GPa or greater.

2. The integrated circuit of claim 1 wherein the CDO film has a dielectric constant of about 2 to about 4.

3. The integrated circuit of claim 1 wherein the CDO film has a dielectric constant less than about 3.

4. The integrated circuit of claim 1 wherein the CDO film has a density less than about 2 g/cm3.

5. The integrated circuit of claim 1 wherein the CDO film has a density of about 1.3 g/cm3 to about 1.4 g/cm3.

6. The integrated circuit of claim 2 wherein the dielectric film is an interlevel dielectric film.

7. The integrated circuit of claim 1 wherein the film has a modulus of about 20 GPa to about 25 GPa.

8. The integrated circuit of claim 7 wherein the dielectric film is about 2 to about 4.

9. The integrated circuit of claim 8 wherein the dielectric film is an interlevel dielectric film.

10. An integrated circuit, including a dielectric film comprising a CDO film having a hardness of about 2.8 GPa to about 3.5 GPa.

11. The integrated circuit of claim wherein the CDO film has a dielectric constant of about 2 to about 4.

12. The integrated circuit of claim 11 wherein the dielectric film is an interlevel dielectric film.

13. The integrated circuit of claim 10 wherein the CDO film has a dielectric constant of about 2 to about 4.

14. The integrated circuit of claim 13 wherein the dielectric film is an interlevel dielectric film.

15. An integrated circuit, including a dielectric film comprising a CDO film having a hardness of about 2.8 GPa or greater and a modulus of about 20 GPa or greater.

16. An integrated circuit of claim 15 wherein the CDO film has a hardness of about 2.8 GPa to about 3.5 GPa and a modulus of about 20 GPa to about 25 GPa.

17. The integrated circuit of claim 16 wherein the CDO film has a dielectric constant of about 2 to about 4.

18. The integrated circuit of claim 17 wherein the dielectric film is an interlevel dielectric film.

* * * * *